US008703880B2

(12) United States Patent
Kashio

(10) Patent No.: US 8,703,880 B2
(45) Date of Patent: Apr. 22, 2014

(54) CURABLE COMPOSITION, CURED PRODUCT, AND METHOD FOR USING OF CURABLE COMPOSITION

(75) Inventor: Mikihiro Kashio, Tokyo (JP)

(73) Assignee: Lintec Corporation, Tokyo (JP)

(*) Notice: Subject to any disclaimer, the term of this patent is extended or adjusted under 35 U.S.C. 154(b) by 0 days.

(21) Appl. No.: 13/583,489

(22) PCT Filed: Mar. 7, 2011

(86) PCT No.: PCT/JP2011/055288
§ 371 (c)(1),
(2), (4) Date: Oct. 19, 2012

(87) PCT Pub. No.: WO2011/111673
PCT Pub. Date: Sep. 15, 2011

(65) Prior Publication Data
US 2013/0035455 A1 Feb. 7, 2013

(30) Foreign Application Priority Data
Mar. 9, 2010 (JP) ................................. 2010-051321

(51) Int. Cl.
*C08L 83/08* (2006.01)
*C08G 77/38* (2006.01)
*C08G 77/24* (2006.01)
*C08F 283/12* (2006.01)

(52) U.S. Cl.
USPC ................. 525/476; 438/781; 528/36; 528/42

(58) Field of Classification Search
USPC .......................... 525/476; 438/781; 528/36, 42
See application file for complete search history.

(56) References Cited

U.S. PATENT DOCUMENTS

| 2008/0199789 A1 | 8/2008 | Abdallah et al. |
| 2008/0249278 A1 | 10/2008 | Kashio et al. |
| 2009/0005530 A1 | 1/2009 | Kashio |
| 2011/0034659 A1 | 2/2011 | Kashio et al. |
| 2011/0054139 A1 | 3/2011 | Kashio et al. |
| 2011/0124812 A1 | 5/2011 | Tamada et al. |

FOREIGN PATENT DOCUMENTS

| JP | 7-309927 A | 11/1995 |
| JP | 2004-359933 A | 12/2004 |
| JP | 2005-263869 A | 9/2005 |
| JP | 2006-328231 A | 12/2006 |
| JP | 2008-88415 A | 4/2008 |
| JP | 2008-116904 A | 5/2008 |
| JP | 2008-266585 A | 11/2008 |
| JP | 2009-1752 A | 1/2009 |
| JP | 2009-30013 A | 2/2009 |
| WO | WO 2008/102259 A2 | 8/2008 |
| WO | WO 2009/101753 A1 | 8/2009 |
| WO | WO 2009/104505 A1 | 8/2009 |
| WO | WO 2009/119634 A1 | 10/2009 |

OTHER PUBLICATIONS

International Search Report, dated May 17, 2011, issued in PCT/JP2011/055288.

*Primary Examiner* — Randy Gulakowski
*Assistant Examiner* — Christopher M Rodd
(74) *Attorney, Agent, or Firm* — Birch, Stewart, Kolasch & Birch, LLP

(57) ABSTRACT

A curable composition that includes (A) a silane compound copolymer that includes a specific repeating unit, (B) a silane coupling agent having a reactive cyclic ether structure, and (C) a curing agent so that the mass ratio "(A):((B)+(C))" of the silane compound copolymer (A) to the silane coupling agent (B) and the curing agent (C) in total is 95:5 to 70:30, a cured product obtained by curing the curable composition, and method for using of the curable composition as an optical device-securing adhesive or an optical device sealing material, are disclosed. The curable composition produces a cured product that does not show coloration (i.e., does not show a deterioration in transparency) even when exposed to high-energy light or subjected to a high temperature, exhibits excellent transparency for a long time, and has high adhesion even at a high temperature. The curable composition may be used to form an optical device-securing material, and may suitably be used as an optical device-securing adhesive or an optical device sealing material.

19 Claims, No Drawings

CURABLE COMPOSITION, CURED PRODUCT, AND METHOD FOR USING OF CURABLE COMPOSITION

TECHNICAL FIELD

The present invention relates to a curable composition that produces a cured product that exhibits excellent transparency, excellent heat resistance, and high adhesion, a cured product obtained by curing the curable composition, and method for using of the curable composition as an optical device-securing adhesive or an optical device sealing material.

BACKGROUND ART

A curable composition has been variously improved depending on the application, and widely used as a material for optical components or molded products, an adhesive, a coating agent, and the like. For example, a curable composition that produces a cured product having excellent transparency is normally used as a material for optical components or a coating agent, and a curable composition that produces a cured product having high adhesion is normally used as an adhesive or a coating agent.

In recent years, a curable composition has also been used as an optical device-securing composition (e.g., optical device-securing adhesive or optical device sealing material) when producing a sealed optical device.

Examples of the optical device include various kinds of lasers (e.g., semiconductor laser diode (LD)), a light-emitting device (e.g., light-emitting diode (LED)), a light-receiving device, a hybrid optical device, an optical integrated circuit, and the like. In recent years, an optical device that emits blue light or white light having a short peak wavelength has been developed, and widely used. The amount of heat generated by optical devices tends to increase due to a significant increase in brightness of light-emitting devices with a short emission peak wavelength.

Along with an increase in brightness of optical devices, a cured product of an optical device-securing composition may deteriorate when exposed to light having higher energy or a higher temperature generated by an optical device, so that cracking or delamination may occur.

In order to solve this problem, Patent Documents 1 to 3 propose an optical device-securing composition that contains a polysilsesquioxane compound as the main component.

However, a cured product of each optical device-securing composition disclosed in Patent Documents 1 to 3 may not exhibit sufficient heat resistance and transparency while exhibiting sufficient adhesion.

As an optical device sealing composition, Patent Document 4 proposes an epoxy resin composition that contains an alicyclic epoxy resin, and Patent Document 5 proposes an epoxy resin composition that contains a polythiol compound.

However, these compositions may not exhibit sufficient light resistance over time, or may show a decrease in adhesion.

RELATED-ART DOCUMENT

Patent Document

Patent Document 1: JP-A-2004-359933
Patent Document 2: JP-A-2005-263869
Patent Document 3: JP-A-2006-328231
Patent Document 4: JP-A-7-309927
Patent Document 5: JP-A-2009-001752

SUMMARY OF THE INVENTION

Technical Problem

The invention was conceived in view of the above situation. An object of the invention is to provide a curable composition that produces a cured product that exhibits excellent heat resistance, excellent transparency, and high adhesion, a cured product obtained by curing the curable composition, and method for using of the curable composition as an optical device-securing adhesive or an optical device-securing sealing material.

Solution to Problem

The inventors of the invention conducted extensive studies in order to achieve the above object. As a result, the inventors found that a composition that includes (A) a specific silane compound copolymer, (B) a silane coupling agent having a reactive cyclic ether structure, and (C) a curing agent in a specific ratio, produces a cured product that exhibits excellent transparency and heat resistance over a long time, and exhibits high adhesion even at a high temperature. This finding has led to the completion of the invention.

A first aspect of the invention provides the following curable composition (see (1) to (8)).

(1) A curable composition including (A) a silane compound copolymer that includes repeating units respectively shown by formulas (i) and (ii), (i) and (iii), (ii) and (iii), or (i), (ii), and (iii), and has a weight average molecular weight of 1000 to 30,000, (B) a silane coupling agent having a reactive cyclic ether structure, and (C) a curing agent so that a mass ratio "(A):((B)+(C))" of the silane compound copolymer (A) to the silane coupling agent (B) and the curing agent (C) in total is 95:5 to 70:30,

[Chemical Formula 1]

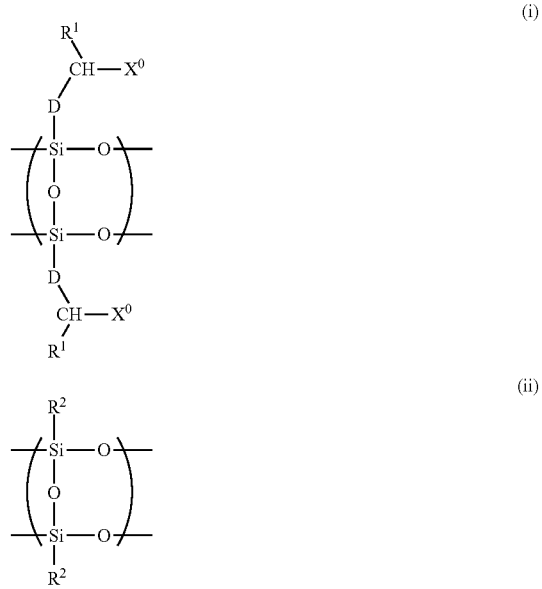

-continued

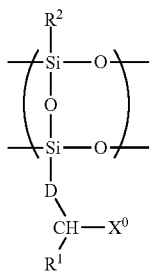
(iii)

wherein $R^1$ represents a hydrogen atom or an alkyl group having 1 to 6 carbon atoms, $X^0$ represents a halogen atom or a group shown by OG (wherein G represents a protecting group for a hydroxyl group), D represents a single bond or a linking group, and $R^2$ represents an alkyl group having 1 to 20 carbon atoms, or a substituted or unsubstituted phenyl group.

(2) The curable composition according to (1), wherein the silane compound copolymer (A) includes a group shown by $R^1$—CH($X^0$)-D- and $R^2$ in a molar ratio) "$R^1$—CH($X^0$)-D:$R^2$" of 60:40 to 5:95.

(3) A curable composition including (A') a silane compound copolymer that is produced by condensing a silane compound mixture, and has a weight average molecular weight of 1000 to 30,000, (B) a silane coupling agent having a reactive cyclic ether structure, and (C) a curing agent so that a mass ratio "(A'):((B)+(C))" of the silane compound copolymer (A') to the silane coupling agent (B) and the curing agent (C) in total is 95:5 to 70:30, the silane compound mixture including at least one silane compound (1) shown by a formula (1) and at least one silane compound (2) shown by a formula (2),

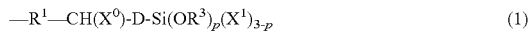
(1)

wherein $R^1$ represents a hydrogen atom or an alkyl group having 1 to 6 carbon atoms, $X^0$ represents a halogen atom or a group shown by OG (wherein G represents a protecting group for a hydroxyl group), D represents a single bond or a linking group, $R^3$ represents an alkyl group having 1 to 6 carbon atoms, $X^1$ represents a halogen atom, and p is an integer from 0 to 3,

(2)

wherein $R^2$ represents an alkyl group having 1 to 20 carbon atoms, or a substituted or unsubstituted phenyl group, $R^4$ represents an alkyl group having 1 to 6 carbon atoms, $X^2$ represents a halogen atom, and q is an integer from 0 to 3.

(4) The curable composition according to (3), wherein the silane compound copolymer (A') is obtained by condensing the at least one silane compound (1) and the at least one silane compound (2) in a molar ratio of 60:40 to 5:95.

(5) The curable composition according to (1) or (3), the curable composition including the silane coupling agent (B) and the curing agent (C) in a mass ratio of 95:5 to 70:30.

(6) The curable composition according to (1) or (3), wherein the silane coupling agent (B) includes a cyclohexene oxide group.

(7) The curable composition according to (1) or (3), wherein the curing agent (C) includes one or more compounds selected from a carboxyl group-containing alicyclic acid anhydride and an alicyclic acid anhydride other than the carboxyl group-containing alicyclic acid anhydride so that a mass ratio of the carboxyl group-containing alicyclic acid anhydride to the alicyclic acid anhydride other than the carboxyl group-containing alicyclic acid anhydride is 100:0 to 10:90.

(8) The curable composition according to (1) or (3), the curable composition being used to produce an optical device-securing material.

A second aspect of the invention provides the following cured product (see (9) and (10)).

(9) A cured product obtained by curing the curable composition according to (1) or (3).

(10) The cured product according to (9), the cured product being an optical device-securing material.

A third aspect of the invention provides the following method of using the curable composition according to the first aspect of the invention (see (11) and (12)).

(11) Method for using of the curable composition according to (1) or (3) as an optical device-securing adhesive.

(12) Method for using of the curable composition according to (1) or (3) as an optical device sealing material.

Effects of the Invention

The curable composition according to the present invention can produce a cured product that exhibits excellent transparency (i.e., does not show a deterioration in transparency due to coloration) over a long time when exposed to high-energy light or subjected to a high temperature, and exhibits high adhesion even at a high temperature.

The curable composition of the present invention may be used to form an optical device-securing material, and may particularly suitably be used as an optical device-securing adhesive or an optical device sealing material.

DESCRIPTION OF EMBODIMENTS

A curable composition, a cured product, and method for using of a curable composition of the present invention are described in detail below.

1) Curable Composition

A curable composition according to one embodiment of the invention includes (A) a silane compound copolymer that includes repeating units respectively shown by the following formulas (i) and (ii), (i) and (ii) and or (i), (ii), and (iii), and has a weight average molecular weight of 1000 to 30,000, (B) a silane coupling agent having a reactive cyclic ether structure, and (C) a curing agent so that a mass ratio "(A):((B)+(C))" of the silane compound copolymer (A) to the silane coupling agent (B) and the curing agent (C) in total is 95:5 to 70:30.

[Chemical Formula 2]

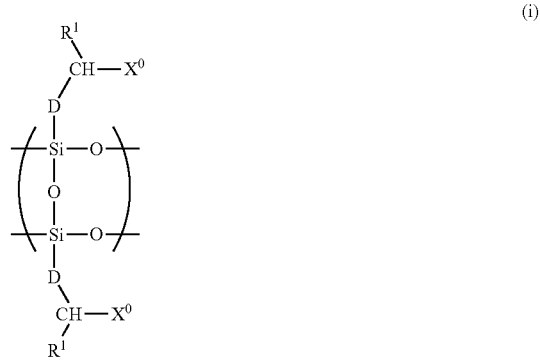
(i)

-continued

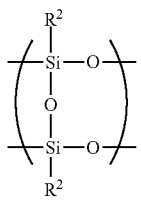
(ii)

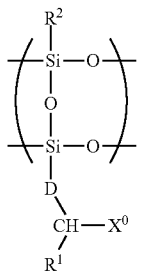
(iii)

wherein $R^1$ represents a hydrogen atom or an alkyl group having 1 to 6 carbon atoms, $X^0$ represents a halogen atom or a group shown by OG (wherein G represents a protecting group for a hydroxyl group), D represents a single bond or a linking group, and $R^2$ represents an alkyl group having 1 to 20 carbon atoms, or a substituted or unsubstituted phenyl group.

Silane Compound Copolymer (A)

The curable composition according to one embodiment of the invention includes the silane compound copolymer that includes the repeating units respectively shown by the formulas (i) and (ii), (i) and (ii) and (iii), or (i), (ii), and (iii), and has a weight average molecular weight of 1000 to 30,000 (hereinafter may be referred to as "silane compound copolymer (A)").

The silane compound copolymer (A) may include only one type of the repeating unit shown by the formula (i), or may include two or more types of the repeating unit shown by the formula (i). The silane compound copolymer (A) may include only one type of the repeating unit shown by the formula (ii), or may include two or more types of the repeating unit shown by the formula (ii). The silane compound copolymer (A) may include only one type of the repeating unit shown by the formula (iii), or may include two or more types of the repeating unit shown by the formula $R^1$ in the formulas (i) to (iii) represents a hydrogen atom or an alkyl group having 1 to 6 carbon atoms, and preferably represents a hydrogen atom.

Examples of the alkyl group having 1 to 6 carbon atoms represented by $R^1$ include a methyl group, an ethyl group, an n-propyl group, an i-propyl group, an n-butyl group, a t-butyl group, an i-butyl group, an s-butyl group, an n-pentyl group, an n-hexyl group, and the like.

$X^0$ represents a halogen atom (e.g., fluorine atom, chlorine atom, bromine atom, or iodine atom) or a group shown by OG.

G represents a protecting group for a hydroxyl group. The protecting group for a hydroxyl group may be an arbitrary protecting group that is known as a protecting group for a hydroxyl group. Examples of the protecting group include an acyl-type protecting group; a silyl-type protecting group such as a trimethylsilyl group, a triethylsilyl group, a t-butyldimethylsilyl group, and a t-butyldiphenylsilyl group; an acetal-type protecting group such as a methoxymethyl group, a methoxyethoxymethyl group, a 1-ethoxyethyl group, a tetrahydropyran-2-yl group, and a tetrahydrofuran-2-yl group; an alkoxycarbonyl-type protecting group such as a t-butoxycarbonyl group; an ether-type protecting group such as a methyl group, an ethyl group, a t-butyl group, an octyl group, an allyl group, a triphenylmethyl group, a benzyl group, a p-methoxybenzyl group, a fluorenyl group, a trityl group, and a benzhydryl group; and the like. The protecting group represented by G is preferably an acyl-type protecting group.

The acyl-type protecting group is shown by —C(=O)$R^5$ (wherein $R^5$ represents an alkyl group having 1 to 6 carbon atoms (e.g., methyl group, ethyl group, n-propyl group, i-propyl group, n-butyl group, i-butyl group, s-butyl group, t-butyl group, or n-pentyl group), or a substituted or unsubstituted phenyl group).

Examples of a substituent that may substitute the unsubstituted phenyl group represented by $R^5$ include an alkyl group such as a methyl group, an ethyl group, an n-propyl group, an i-propyl group, an n-butyl group, an s-butyl group, an i-butyl group, a t-butyl group, an n-pentyl group, an n-hexyl group, an n-heptyl group, an n-octyl group, and an i-octyl group; a halogen atom such as a fluorine atom, a chlorine atom, and a bromine atom; an alkoxy group such as a methoxy group and an ethoxy group; and the like.

$X^0$ preferably represents a chlorine atom or the group shown by OG' (wherein G' represents an acyl-type protecting group), more preferably a chlorine atom or an acetoxy group, and particularly preferably an acetoxy group, from the viewpoint of availability and a capability to produce a cured product that exhibits high adhesion.

D represents a single bond or a linking group.

The linking group may be a substituted or unsubstituted divalent organic group. The organic group preferably has 1 to 20 carbon atoms, and more preferably 1 to 10 carbon atoms.

Examples of the substituted or unsubstituted divalent organic group include a substituted or unsubstituted alkylene group; a substituted or unsubstituted alkenylene group; a substituted or unsubstituted alkynylene group; a substituted or unsubstituted arylene group; a divalent group formed by a combination of a substituted or unsubstituted arylene group and a substituted or unsubstituted alkylene group, a substituted or unsubstituted alkenylene group, or a substituted or unsubstituted alkynylene group; and the like.

Examples of the alkylene group that may be substituted with a substituent include an alkylene group having 1 to 20 carbon atoms such as a methylene group, an ethylene group, a propylene group, a trimethylene group, a tetramethylene group, a pentamethylene group, and a hexamethylene group. The alkylene group is preferably an alkylene group having 1 to 10 carbon atoms.

Examples of the alkenylene group that may be substituted with a substituent include an alkenylene group having 2 to 20 carbon atoms such as a vinylene group, a propenylene group, a butenylene group, and a pentenylene group. The alkenylene group is preferably an alkenylene group having 2 to 12 carbon atoms.

Examples of the alkynylene group that may be substituted with a substituent include an alkynylene group having 2 to 20 carbon atoms such as an ethynylene group and a propynylene group. The alkynylene group is preferably an alkynylene group having 2 to 10 carbon atoms.

Examples of the arylene group that may be substituted with a substituent include an arylene group having 6 to 20 carbon atoms such as an o-phenylene group, an m-phenylene group, a p-phenylene group, and a 2,6-naphthylene group. The arylene group is preferably an arylene group having 6 to 10 carbon atoms.

Examples of a substituent that may substitute the alkylene group, the alkenylene group, and the alkynylene group include a halogen atom such as a fluorine atom and a chlorine atom; an alkoxy group such as a methoxy group and an ethoxy group; an alkylthio group such as a methylthio group and an ethylthio group; an alkoxycarbonyl group such as a methoxycarbonyl group and an ethoxycarbonyl group; and the like.

Examples of a substituent that may substitute the arylene group include a cyano group; a nitro group; a halogen atom such as a fluorine atom, a chlorine atom, and a bromine atom; an alkyl group such as a methyl group and an ethyl group; an alkoxy group such as a methoxy group and an ethoxy group; an alkylthio group such as a methylthio group and an ethylthio group; and the like.

These substituents may be bonded to an arbitrary position of the alkylene group, the alkenylene group, the alkynylene group, or the arylene group. A plurality of identical or different substituents may be bonded to the alkylene group, the alkenylene group, the alkynylene group, or the arylene group.

Examples of the divalent group formed by a combination of a substituted or unsubstituted arylene group and a substituted or unsubstituted alkylene group, a substituted or unsubstituted alkenylene group, or a substituted or unsubstituted alkynylene group include a group in which at least one group among a substituted or unsubstituted alkylene group, a substituted or unsubstituted alkenylene group, and a substituted or unsubstituted alkynylene group is linearly bonded to at least one substituted or unsubstituted arylene group. Specific examples of the divalent group include the groups shown by the following formulas.

[Chemical Formula 3]

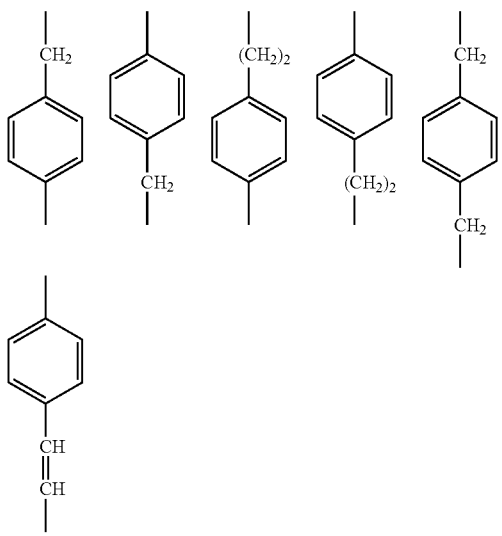

D preferably represents an alkylene group having 1 to 10 carbon atoms, more preferably an alkylene group having 1 to 6 carbon atoms, and particularly preferably a methylene group or an ethylene group, since a cured product that exhibits high adhesion can be obtained.

$R^2$ in the formulas (i) to (iii) represents an alkyl group having 1 to 20 carbon atoms, or a substituted or unsubstituted phenyl group.

Examples of the alkyl group having 1 to 20 carbon atoms represented by $R^2$ include a methyl group, an ethyl group, an n-propyl group, an i-propyl group, an n-butyl group, an s-butyl group, a t-butyl group, an n-pentyl group, an n-hexyl group, an n-octyl group, an i-octyl group, an n-nonyl group, an n-decyl group, an n-dodecyl group, and the like.

Examples of a substituent that may substitute the unsubstituted phenyl group represented by $R^2$ include an alkyl group such as a methyl group, an ethyl group, an n-propyl group, an i-propyl group, an n-butyl group, an s-butyl group, an i-butyl group, a t-butyl group, an n-pentyl group, an n-hexyl group, an n-heptyl group, an n-octyl group, and an i-octyl group; an alkoxy group such as a methoxy group and an ethoxy group; a halogen atom such as a fluorine atom and a chlorine atom; and the like.

Specific examples of the substituted or unsubstituted phenyl group represented by $R^2$ include a phenyl group, a 2-chlorophenyl group, a 4-methylphenyl group, a 3-ethylphenyl group, a 2,4-dimethylphenyl group, a 2-methoxyphenyl group, and the like.

The silane compound copolymer (A) preferably includes a group shown by) $R^1$—CH($X^0$)-D- and a group represented by $R^2$ in a molar ratio "$R^1$—CH($X^0$)-D:$R^2$" of 60:40 to 5:95. If the molar ratio "$R^1$—CH($X^0$)-D:$R^2$" is within the above range, a cured product that exhibits excellent transparency, excellent adhesion, and excellent heat resistance can be obtained.

The content of the group shown by $R^1$—CH($X^0$)-D- and the content of the group represented by $R^2$ may be determined by measuring the NMR spectrum of the silane compound copolymer (A), for example.

The silane compound copolymer (A) may be a random copolymer, a block copolymer, a graft copolymer, an alternating copolymer, or the like. It is particularly preferable that the silane compound copolymer (A) be a random copolymer.

The weight average molecular weight (Mw) of the silane compound copolymer (A) is 1000 to 30,000, and preferably 1500 to 6000. If the weight average molecular weight (Mw) is within the above range, the resulting composition has an excellent handling capability, and produces a cured product that exhibits excellent adhesion and heat resistance. The weight average molecular weight (Mw) of the silane compound copolymer (A) may be determined as a standard polystyrene-reduced value by gel permeation chromatography (GPC) using tetrahydrofuran (THF) as a solvent, for example.

The molecular weight distribution (Mw/Mn) of the silane compound copolymer (A) is not particularly limited, but is normally 1.0 to 3.0, and preferably 1.1 to 2.0. If the molecular weight distribution (Mw/Mn) is within the above range, the resulting cured product exhibits excellent adhesion and heat resistance.

These silane compound copolymers (A) may be used either alone or in combination.

The silane compound copolymer (A) is a polysilsesquioxane compound having a ladder structure.

Whether or not the silane compound copolymer has a ladder structure may be determined by measuring the infrared absorption spectrum, the X-ray diffraction, or the NMR of the reaction product, for example.

The silane compound copolymer (A) included in the curable composition according to one embodiment of the invention may be a silane compound copolymer that is produced by condensing a silane compound mixture, and has a weight average molecular weight of 1000 to 30,000, the silane compound mixture including at least one silane compound (1) shown by the following formula (1) and at least one silane compound (2) shown by the following formula (2) (hereinafter may be referred to as "silane compound copolymer (A')"). It is preferable that the silane compound copolymer (A) be the silane compound copolymer (A').

$$R^1\text{—CH}(X^0)\text{-D-Si}(OR^3)_p(X^1)_{3-p} \tag{1}$$

wherein $R^1$ represents a hydrogen atom or an alkyl group having 1 to 6 carbon atoms, $X^0$ represents a halogen atom or a group shown by OG (wherein G represents a protecting group for a hydroxyl group), D represents a single bond or a linking group, $R^3$ represents an alkyl group having 1 to 6 carbon atoms, $X^1$ represents a halogen atom, and p is an integer from 0 to 3.

$$R^2Si(OR^4)_q(X^2)_{3-q} \qquad (2)$$

wherein $R^2$ represents an alkyl group having 1 to 20 carbon atoms, or a substituted or unsubstituted phenyl group, $R^4$ represents an alkyl group having 1 to 6 carbon atoms, $X^2$ represents a halogen atom, and q is an integer of 0 to 3.

Silane Compound (1)

The silane compound (1) is shown by the formula (1) ($R^1$—CH($X^0$)-D-Si($OR^3$)$_p$($X^1$)$_{3-p}$). A silane compound copolymer that exhibits excellent transparency and excellent adhesion even after being cured can be obtained using the silane compound (1).

$R^1$ in the formula (1) represents a hydrogen atom or an alkyl group having 1 to 6 carbon atoms. Among these, a hydrogen atom is preferable. Specific examples of the alkyl group having 1 to 6 carbon atoms represented by $R^1$ include those mentioned above in connection with $R^1$ included in the silane compound copolymer (A).

$X^0$ in the formula (1) represents a halogen atom (e.g., fluorine atom, chlorine atom, bromine atom, or iodine atom) or the group shown by OG (wherein G represents a protecting group for a hydroxyl group), and D represents a single bond or a linking group. Specific examples of the groups represented by $X^0$ and D include those mentioned above in connection with $X^0$ and D included in the silane compound copolymer (A).

$R^3$ represents an alkyl group having 1 to 6 carbon atoms, such as a methyl group, an ethyl group, an n-propyl group, an i-propyl group, an n-butyl group, an s-butyl group, an i-butyl group, a t-butyl group, an n-pentyl, or an n-hexyl group.

$X^1$ represents a halogen atom such as a fluorine atom, a chlorine atom, a bromine atom, or an iodine atom.

p is an integer from 0 to 3.

When p is an integer equal to or larger than 2, $OR^3$ may be either identical or different. When (3-p) is an integer equal to or larger than 2, $X^1$ may be either identical or different.

Specific examples of the silane compound (1) include trialkoxysilane compounds in which $X^0$ represents a halogen atom, such as chloromethyltrimethoxysilane, bromomethyltriethoxysilane, 2-chloroethyltripropoxysilane, 2-bromoethyltributoxysilane, 3-chloropropyltrimethoxysilane, 3-chloropropyltriethoxysilane, 3-chloropropyltripropoxysilane, 3-chloropropyltributoxysilane, 3-bromopropyltrimethoxysilane, 3-bromopropyltriethoxysilane, 3-bromopropyltripropoxysilane, 3-bromopropyltributoxysilane, 3-fluoropropyltrimethoxysilane, 3-fluoropropyltriethoxysilane, 3-fluoropropyltripropoxysilane, 3-fluoropropyltributoxysilane, 3-iodopropyltrimethoxysilane, 2-chloroethyltrimethoxysilane, 3-chloropropyltriethoxysilane, 4-chlorobutyltripropoxysilane, 5-chloropentyltripropoxysilane, 2-chloropropyltrimethoxysilane, 3-chloro-3-acetylpropyltrimethoxysilane, 3-chloro-3-methoxycarbonylpropyltrimethoxysilane, o-(2-chloroethyl)phenyltripropoxysilane, m-(2-chloroethyl)phenyltrimethoxysilane, p-(2-chloroethyl)phenyltriethoxysilane, and p-(2-fluoroethyl)phenyltrimethoxysilane;

halogenosilane compounds in which $X^0$ represents a halogen atom, such as chloromethyltrichlorosilane, bromomethylbromodimethoxysilane, 2-chloroethyldichloromethoxysilane, 2-bromoethyldichloroethoxysilane, 3-chloropropyltrichlorosilane, 3-chloropropyltribromosilane, 3-chloropropyldichloromethoxysilane, 3-chloropropyldichloroethoxysilane, 3-chloropropylchlorodimethoxysilane, 3-chloropropylchlorodiethoxysilane, 3-bromopropyldichloroethoxysilane, 3-bromopropyltribromosilane, 3-bromopropyltrichlorosilane, 3-bromopropylchlorodimethoxysilane, 3-fluoropropyltrichlorosilane, 3-fluoropropylchlorodimethoxysilane, 3-fluoropropyldichloromethoxysilane, 3-fluoropropylchlorodiethoxysilane, 3-iodopropyltrichlorosilane, 4-chlorobutylchlorodiethoxysilane, 3-chloro-n-butylchlorodiethoxysilane, 3-chloro-3-acetylpropyldichloroethoxysilane, and 3-chloro-3-methoxycarbonylpropyltribromosilane;

trialkoxysilane compounds in which $X^0$ represents the group shown by OG, such as 3-acetoxypropyltrimethoxysilane, 3-acetoxypropyltriethoxysilane, 3-acetoxypropyltripropoxysilane, 3-acetoxypropyltributoxysilane, 3-propionyloxypropyltrimethoxysilane, 3-propionyloxypropyltriethoxysilane, 3-benzoyloxypropyltrimethoxysilane, 3-benzoyloxypropyltriethoxysilane, 3-benzoyloxypropyltripropoxysilane, 3-benzoyloxypropyltributoxysilane, 2-trimethylsilyloxyethyltrimethoxysilane, 3-triethylsilyloxypropyltriethoxysilane, 3-(2-tetrahydropyranyloxy)propyltripropoxysilane, 3-(2-tetrahydrofuranyloxy)propyltributoxysilane, 3-methoxymethyloxypropyltrimethoxysilane, 3-methoxyethoxymethyloxypropyltriethoxysilane, 3-(1-ethoxyethyloxy)propyltripropoxysilane, 3-(t-butoxycarbonyloxy)propyltrimethoxysilane, 3-t-butoxypropyltrimethoxysilane, 3-benzyloxypropyltriethoxysilane, and 3-triphenylmethoxypropyltriethoxysilane;

halogenosilane compounds in which $X^0$ represents the group shown by OG, such as 3-acetoxypropyltrichlorosilane, 3-acetoxypropyltribromosilane, 3-acetoxypropyldichloromethoxysilane, 3-acetoxypropyldichloroethoxysilane, 3-acetoxypropylchlorodimethoxysilane, 3-acetoxypropylchlorodiethoxysilane, 3-benzoyloxypropyltrichlorosilane, 3-trimethylsilyloxypropylchlorodimethoxysilane, 3-triethylsilyloxypropyldichloromethoxysilane, 3-(2-tetrahydropyranyloxy)propylchlorodiethoxysilane, 3-(2-tetrahydrofuranyloxy)propyldichloroethoxysilane, 3-methoxymethyloxypropyltribromosilane, 3-methoxyethoxymethyloxypropyltrichlorosilane, 3-(1-ethoxyethyloxy)propylchlorodimethoxysilane, 3-t-butoxycarbonyloxypropyldichloromethoxysilane, 3-t-butoxypropylchlorodiethoxysilane, 3-triphenylmethoxypropyldichloroethoxysilane, and 3-benzyloxypropyltribromosilane; and the like.

These silane compounds (1) may be used either alone or in combination.

It is preferable that the silane compound (1) be a trialkoxysilane compound in which $X^0$ represents a halogen atom, or a trialkoxysilane compound in which $X^0$ represents the group shown by OG. It is more preferable that the silane compound (1) be a trialkoxysilane compound that includes a 3-chloropropy group or a trialkoxysilane compound that includes a 3-acetoxypropyl group. In such a case, a cured product that exhibits more excellent adhesion can be obtained.

Silane Compound (2)

The silane compound (2) is shown by the formula (2) ($R^2Si(OR^4)_q(X^2)_{3-q}$).

$R^2$ in the formula (2) represents an alkyl group having 1 to 20 carbon atoms, or a substituted or unsubstituted phenyl group. Specific examples of the group represented by $R^2$ include those mentioned above in connection with $R^2$ included in the silane compound copolymer (A).

$R^4$ represents an alkyl group having 1 to 6 carbon atoms similar to that represented by $R^3$.

$X^2$ represents a halogen atom similar to that represented by $X^1$.

q is an integer from 0 to 3.

When q is an integer equal to or larger than 2, $OR^4$ may be either identical or different. When (3-p) is an integer equal to or larger than 2, $X^2$ may be either identical or different.

Specific examples of the silane compound (2) include alkyltrialkoxysilane compounds such as methyltrimethoxysilane, methyltriethoxysilane, ethyltrimethoxysilane, ethyltriethoxysilane, n-propyltrimethoxysilane, n-butyltriethoxysilane, i-butyltrimethoxysilane, n-pentyltriethoxysilane, n-hexyltrimethoxysilane, i-octyltriethoxysilane, dodecyltrimethoxysilane, methyldimethoxyethoxysilane, and methyldiethoxymethoxysilane; alkylhalogenoalkoxysilane compounds such as methylchlorodimethoxysilane, methyldichloromethoxysilane, methylchlorodiethoxysilane, ethylchlorodimethoxysilane, ethyldichloromethoxysilane, n-propylchlorodimethoxysilane, and n-propyldichloromethoxysilane; alkyltrihalogenosilane compounds such as methyltrichlorosilane, methyltribromosilane, ethyltrichlorosilane, ethyltribromosilane, and n-propyltrichlorosilane;

substituted or unsubstituted phenyltrialkoxysilane compounds such as phenyltrimethoxysilane, 4-methoxyphenyltrimethoxysilane, 2-chlorophenyltrimethoxysilane, phenyltriethoxysilane, 2-methoxyphenyltriethoxysilane, phenyldimethoxyethoxysilane, and phenyldiethoxymethoxysilane; substituted or unsubstituted phenylhalogenoalkoxysilane compounds such as phenylchlorodimethoxysilane, phenyldichloromethoxysilane, phenylchloromethoxyethoxysilane, phenylchlorodiethoxysilane, and phenyldichloroethoxysilane; and substituted or unsubstituted phenyltrihalogenosilane compounds such as phenyltrichlorosilane, phenyltribromosilane, 4-methoxyphenyltrichlorosilane, 2-chlorophenyltrichlorosilane, and 2-ethoxyphenyltrichlorosilane.

These silane compounds (2) may be used either alone or in combination.

Silane Compound Mixture

The silane compound mixture that is used to produce the silane compound copolymer (A') may be a mixture of the silane compound (1) and the silane compound (2), or may further include a silane compound other than the silane compound (1) and the silane compound (2) insofar as the object of the invention is not impaired. It is preferable that the silane compound mixture be a mixture of the silane compound (1) and the silane compound (2).

The silane compound (1) and the silane compound (2) are preferably used in a molar ratio of 60:40 to 5:95.

The silane compound mixture may be condensed by an arbitrary method. For example, the silane compound mixture may be condensed by dissolving the silane compound (1), the silane compound (2), and an additional silane compound in a solvent, adding a given amount of catalyst to the solution, and stirring the mixture at a given temperature.

The catalyst may be either an acid catalyst or a base catalyst.

Examples of the acid catalyst include inorganic acids such as hydrochloric acid, sulfuric acid, nitric acid, and phosphoric acid; organic acids such as methanesulfonic acid, trifluoromethanesulfonic acid, benzenesulfonic acid, p-toluenesulfonic acid, acetic acid, and trifluoroacetic acid; and the like.

Examples of the base catalyst include organic bases such as trimethylamine, triethylamine, lithium diisopropylamide, lithium bis(trimethylsilyl)amide, pyridine, 1,8-diazabicyclo[5.4.0]-7-undecene, aniline, picoline, 1,4-diazabicyclo[2.2.2]octane, and imidazole; organic base hydroxides such as tetramethylammonium hydroxide and tetraethylammonium hydroxide; metal alcoholates such as sodium methoxide, sodium ethoxide, sodium t-butoxide, and potassium t-butoxide; metal hydrides such as sodium hydride and calcium hydride; metal hydroxides such as sodium hydroxide, potassium hydroxide, and calcium hydroxide; metal carbonates such as sodium carbonate, potassium carbonate, and magnesium carbonate; metal hydrogen carbonates such as sodium hydrogen carbonate and potassium hydrogen carbonate; and the like.

Among these, acid catalysts are preferable, and inorganic acids are more preferable.

The catalyst is normally used in an amount of 0.1 to 10 mol %, and preferably 1 to 5 mol %, based on the total number of moles of the silane compounds.

The solvent may be appropriately selected depending on the type of the silane compounds and the like. Examples of the solvent include water; aromatic hydrocarbons such as benzene, toluene, and xylene; esters such as methyl acetate, ethyl acetate, propyl acetate, and methyl propionate; ketones such as acetone, methyl ethyl ketone, methyl i-butyl ketone, and cyclohexanone; alcohols such as methyl alcohol, ethyl alcohol, n-propyl alcohol, i-propyl alcohol, n-butyl alcohol, i-butyl alcohol, s-butyl alcohol, and t-butyl alcohol; and the like. These solvents may be used either alone or in combination.

Among these, water, aromatic hydrocarbons, or a mixture thereof are preferable, and a mixture of water and toluene is particularly preferable. When using water and toluene, the ratio (volume ratio) of water to toluene is preferably 1:9 to 9:1 and more preferably 7:3 to 3:7.

The solvent is normally used so that the total number of moles of the silane compounds is 0.1 to 10 mol, and preferably 0.5 to 10 mol, per liter of the solvent.

The silane compounds are normally condensed (reacted) in a temperature range from 0° C. to the boiling point of the solvent (preferably 20 to 100° C.). If the reaction temperature is too low, the condensation reaction may proceed insufficiently. If the reaction temperature is too high, gelation may occur. The reaction time is normally 30 minutes to 20 hours.

After completion of the condensation reaction, the mixture is neutralized by adding an alkali (e.g., sodium hydrogen carbonate) aqueous solution when using a acid catalyst, or neutralized by adding an acid (e.g., hydrochloric acid) when using a base catalyst. Salts thus produced are removed by filtration, washing with water, or the like to obtain the target silane compound copolymer.

Silane Coupling Agent (B)

The curable composition according to one embodiment of the invention includes a silane coupling agent having a reactive cyclic ether structure (hereinafter may be referred to as "silane coupling agent (B)"). The curable composition according to one embodiment of the invention that includes the silane coupling agent (B) does not undergo phase separation (is not clouded), and can produce a cured product that exhibits excellent transparency and high adhesion.

The reactive cyclic ether structure of the silane coupling agent (B) includes a reactive cyclic ether group. Examples of the reactive cyclic ether group include an epoxy group; a cyclohexene oxide group such as 3,4-epoxycyclohexyl group and the like; an oxetanyl group; a tetrahydrofuranyl group; a tetrahydropyranyl group; and the like. Among these, an epoxy group, a cyclohexene oxide group, and an oxetanyl group are preferable, a cyclohexene oxide group is more preferable, and 3,4-epoxycyclohexyl group is particularly preferable.

Specific examples of the reactive cyclic ether group include groups shown by the following formulas (E1) to (E3).

[Chemical Formula 4]

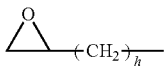
(E1)

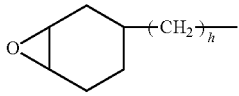
(E2)

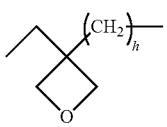
(E3)

wherein h is an integer from 1 to 10, and an ether bond (—O—) may be included in the group represented by —$(CH_2)_h$—.

The reactive cyclic ether group is preferably the group shown by the formula (E2), and particularly preferably the group shown by the formula (E2) wherein h is an integer from 2 to 8.

The silane coupling agent (B) is preferably an organosilicon compound that includes a reactive cyclic ether group (E) and a hydrolyzable group ($OR^b$) in one molecule. Specific examples of such an organosilicon compound include a compound shown by the following formula (b).

[Chemical Formula 5]

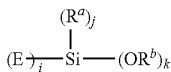
(b)

wherein E represents a reactive cyclic ether group, $R^a$ represents an alkyl group having 1 to 6 carbon atoms, or a substituted or unsubstituted phenyl group, $R^b$ represents an alkyl group having 1 to 6 carbon atoms, i is an integer from 1 to 3, j is an integer from 0 to 2, and k is an integer from 1 to 3, provided that i+j+k=4 is satisfied.

Examples of the alkyl group having 1 to 6 carbon atoms represented by $R^a$ and $R^b$ include those mentioned above in connection with $R^1$. Examples of the substituted or unsubstituted phenyl group represented by $R^a$ include those mentioned above in connection with $R^2$.

Specific examples of the silane coupling agent shown by the formula (b) include cyclohexene oxide group-containing silane coupling agents such as 2-(3,4-epoxycyclohexyl)ethyltrimethoxysilane and 2-(3,4-epoxycyclohexyl)ethyltriethoxysilane; glycidoxy group-containing silane coupling agents such as 3-glycidoxypropyltrimethoxysilane, 3-glycidoxypropyltriethoxysilane, 3-glycidoxypropylmethyldimethoxysilane, and 3-glycidoxypropylmethyldiethoxysilane; oxetanyl group-containing silane coupling agents such as (oxetan-3-yl)methyltrimethoxysilane, (oxetan-3-yl)methyltriethoxysilane, (oxetan-3-yl)methylmethyldimethoxysilane, (oxetan-3-yl)methylmethyldiethoxysilane, (oxetan-3-yl)methylethyldimethoxysilane, (oxetan-3-yl)methylethyldiethoxysilane, (oxetan-3-yl)methylphenyldimethoxysilane, (oxetan-3-yl)methylphenyldiethoxysilane, 2-(oxetan-3'-yl)ethyltrimethoxysilane, and 2-(oxetan-3'-yl)ethyltriethoxysilane; and the like.

Among these, a compound shown by the following formula (b-1) is preferable from the viewpoint of availability and a capability to produce a cured product that exhibits high adhesion.

[Chemical Formula 6]

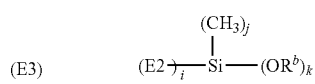
(b-1)

wherein E2, $R^b$, i, j, and k are the same as defined above. $R^b$ preferably represents a substituted or unsubstituted alkyl group having 1 to 6 carbon atoms (e.g., methyl group, ethyl group, propyl group, or methoxymethyl group).

Specific examples of the silane coupling agent shown by the formula (b-1) include 2-(3,4-epoxycyclohexyl)ethyltrimethoxysilane, 2-(3,4-epoxycyclohexyl)ethyltriethoxysilane, 2-(3,4-epoxycyclohexyl)methyltrimethoxysilane, 2-(3,4-epoxycyclohexyl)dimethylmethoxysilane, and the like.

These silane coupling agents (B) may be used either alone or in combination.

Curing Agent (C)

The curable composition according to one embodiment of the invention includes the curing agent as the component (C) (hereinafter may be referred to as "curing agent (C)").

The curing agent (C) is not particularly limited insofar as the curing agent (C) is a compound that includes a functional group that may react with a reactive cyclic ether group. Examples of the curing agent (C) include an aliphatic amine curing agent, an alicyclic amine curing agent, a secondary or tertiary amine curing agent, an aromatic amine curing agent, dicyandiamide, boron trifluoride amine complex salts, imidazole compounds, aliphatic acid anhydrides, alicyclic acid anhydrides, and the like.

Among these, aliphatic acid anhydrides and alicyclic acid anhydrides are preferable since a cured product that exhibits excellent heat resistance can be obtained.

Examples of the aliphatic acid anhydrides include polyadipic anhydride and polyazelaic anhydride.

Examples of the alicyclic acid anhydrides include 3-methyl-1,2,3,6-tetrahydrophthalic anhydride, 4-methyl-1,2,3,6-tetrahydrophthalic anhydride, tetrahydrophthalic anhydride, 3-methylhexahydrophthalic anhydride, 4-methylhexahydrophthalic anhydride, hexahydrophthalic anhydride, methylnadic anhydride, 5-norbornene-2,3-dicarboxylic anhydride, norbornane-2,3-dicarboxylic anhydride, methyl-5-norbornene-2,3-dicarboxylic anhydride, methylnorbornane-2,3-dicarboxylic anhydride, and the like.

Among these, 3-methylhexahydrophthalic anhydride and 4-methylhexahydrophthalic anhydride are preferable, and 4-methylhexahydrophthalic anhydride is particularly preferable.

These aliphatic acid anhydrides and alicyclic acid anhydrides may be used either alone or in combination.

The curing agent (C) preferably includes a carboxyl group-containing alicyclic acid anhydride and an alicyclic acid anhydride other than the carboxyl group-containing alicyclic acid anhydride since a cured product that exhibits high adhesion even at a high temperature can be obtained.

The carboxyl group-containing alicyclic acid anhydride is a compound in which the alicyclic structure of the alicyclic acid anhydride is substituted with a carboxyl group at an arbitrary position.

The number of carboxyl groups as a substituent and the substitution position are not particularly limited.

The carboxyl group-containing alicyclic acid anhydrides may be used either alone or in combination.

The carboxyl group-containing alicyclic acid anhydride is preferably cyclohexane-1,2,4-tricarboxylic acid 1,2-anhydride or cyclohexane-1,2,3-tricarboxylic acid 1,2-anhydride obtained by substituting hexahydrophthalic anhydride with a carboxyl group, and particularly preferably cyclohexane-1,2,4-tricarboxylic acid 1,2-anhydride. There may be stereoisomers in this compound. An arbitrary stereoisomer of the compound may be used.

In case of using the carboxyl group-containing alicyclic acid anhydride, it is preferably that the mass ratio of the carboxyl group-containing alicyclic acid anhydride to the alicyclic acid anhydride other than the carboxyl group-containing alicyclic acid anhydride is 100:0 to 10:90.

The curable composition according to one embodiment of the invention may further include a curing catalyst.

Examples of the curing catalyst include 2-methylimidazole, triphenylphosphine, and the like.

The curable composition according to one embodiment of the invention includes the components (A), (B), and (C) so that the mass ratio "(A):((B)+(C))" is 95:5 to 70:30, or includes the components (A'), (B), and (C) so that the mass ratio "(A'):(B)+(C)" is 95:5 to 70:30.

The curable composition preferably includes the components (B) and (C) in a mass ratio of 95:5 to 70:30.

If the curable composition includes each component so that the mass ratio is within the above range, it is possible to obtain a curable composition that produces a cured product that exhibits excellent transparency and excellent heat resistance for a long time, and has high adhesion even at a high temperature.

The curable composition according to one embodiment of the invention may include an additional component other than the above components insofar as the object of the invention is not impaired.

Examples of the additional component include a silane coupling agent other than the silane coupling agent (B), an antioxidant, a UV absorber, a light stabilizer, a diluent, and the like.

The silane coupling agent other than the silane coupling agent (B) is not particularly limited insofar as the object of the invention is not impaired. It is preferable to use a silane coupling agent having an acid anhydride structure since a cured product that exhibits even higher adhesion can be obtained.

The silane coupling agent having an acid anhydride structure is an organosilicon compound that includes a group (Y) having an acid anhydride structure and a hydrolyzable group ($OR^d$) in one molecule. Specific examples of such an organosilicon compound include a compound shown by the following formula (d).

[Chemical Formula 7]

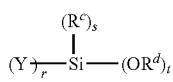
(d)

wherein Y represents a group having an acid anhydride structure, $R^c$ represents an alkyl group having 1 to 6 carbon atoms, or a substituted or unsubstituted phenyl group (similar to that represented by $R^a$), $R^d$ represents an alkyl group having 1 to 6 carbon atoms (similar to that represented by $R^b$), r is an integer from 1 to 3, s is an integer from 0 to 2, and t is an integer from 1 to 3, provided that r+s+t=4 is satisfied.

Examples of the group represented by Y include groups shown by the following formulas, and the like.

[Chemical Formula 8]

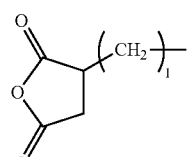
(Y1)

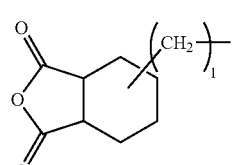
(Y2)

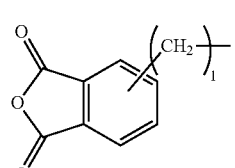
(Y3)

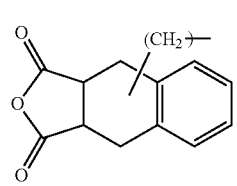
(Y4)

wherein l is an integer from 0 to 10, and preferably an integer from 2 to 8. Among these, the group shown by the formula (Y1) is particularly preferable.

The compound shown by the formula (d) is preferably a compound shown by the following formula (d-1).

[Chemical Formula 9]

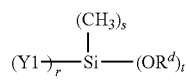
(d-1)

wherein Y1, $R^d$, r, s, and t are the same as defined above.

Specific examples of the silane coupling agent shown by the formula (d-1) include 2-(trimethoxysilyl)ethylsuccinic anhydride, 3-(triethoxysilyl)propylsuccinic anhydride, and the like.

These silane coupling agents having an acid anhydride structure may be used either alone or in combination.

The silane coupling agent having an acid anhydride structure is used in an amount of 0.1 to 20 parts by mass, and preferably 0.5 to 10 parts by mass, based on the 100 parts by mass of the component (A) or (A').

The antioxidant is added to the curable composition in order to prevent a deterioration due to oxidation during heating. Examples of the antioxidant include a phosphorus-containing antioxidant, a phenol antioxidant, a sulfur-containing antioxidant, and the like.

Examples of the phosphorus-containing antioxidant include phosphites such as triphenyl phosphite, diphenylisodecyl phosphite, phenyldiisodecyl phosphite, tris(nonylphenyl) phosphite, diisodecylpentaerythritol phosphite, tris(2,4-di-t-butylphenyl) phosphite, cyclic neopentanetetraylbis(octadecyl) phosphite, cyclic neopentanetetraylbis(2,4-di-t-butylphenyl) phosphate, cyclic neopentanetetraylbis(2,4-di-t-butyl-4-methylphenyl) phosphate, and bis[2-t-butyl-6-methyl-4-{2-(octadecyloxycarbonyl)ethyl}phenyl] hydrogen phosphate; and oxaphosphaphenanthrene oxides such as 9,10-dihydro-9-oxa-10-phosphaphenanthrene 10-oxide, 10-(3,5-di-t-butyl-4-hydroxybenzyl)-9,10-dihydro-9-oxa-10-phosphaphenanthrene 10-oxide, and 10-desiloxy-9,10-dihydro-9-oxa-10-phosphaphenanthrene 10-oxide.

Examples of the phenol antioxidant include monophenols such as 2,6-di-t-butyl-p-cresol, dibutylhydroxytoluene, butylated hydroxyanisole, 2,6-di-t-butyl-p-ethylphenol, and stearyl-β-(3,5-di-t-butyl-4-hydroxyphenyl)propionate; bisphenols such as 2,2'-methylenebis(4-methyl-6-t-butylphenol), 2,2'-methylenebis(4-ethyl-6-t-butylphenol), 4,4'-thiobis(3-methyl-6-t-butylphenol), 4,4'-butylidenebis(3-methyl-6-t-butylphenol), and 3,9-bis[1,1-dimethyl-2-{P-(3-t-butyl-4-hydroxy-5-methylphenyl)propionyloxy}ethyl]-2,4,8,10-tetraoxaspiro[5,5]undecane; and polyphenols such as 1,1,3-tris(2-methyl-4-hydroxy-5-t-butylphenyl)butane, 1,3,5-trimethyl-2,4,6-tris(3,5-di-t-butyl-4-hydroxybenzyl)benzene, tetrakis[methylene-3-(3',5'-di-t-butyl-4'-hydroxyphenyl)propionate]methane, bis[3,3'-bis-(4'-hydroxy-3'-t-butylphenyl)butyric acid]glycol ester, 1,3,5-tris(3',5'-di-t-butyl-4'-hydroxybenzyl)-S-triazine-2,4,6-(1H,3H,5H) trione, and tocophenol.

Examples of the sulfur-containing antioxidant include dilauryl 3,3'-thiodipropionate, dimyristyl 3,3'-thiodipropionate, distearyl 3,3'-thiodipropionate, and the like.

These antioxidants may be used either alone or in combination. Since the curable composition according to one embodiment of the invention includes the component (B), a deterioration due to oxidation hardly occurs during heating. The antioxidant is normally used in an amount of 0 to 10 parts by mass based on 100 parts by mass of the component (A) or (A').

The UV absorber is added to the curable composition in order to improve the light resistance of the resulting cured product.

Examples of the UV absorber include salicylic acid esters such as phenyl salicylate, p-t-butylphenyl salicylate, and p-octylphenyl salicylate; benzophenones such as 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone, and 2-hydroxy-4-methoxy-5-sulfobenzophenone; benzotriazoles such as 2-(2'-hydroxy-5'-methylphenyl)benzotriazole, 2-(2'-hydroxy-5'-t-butylphenyl)benzotriazole, 2-(2'-hydroxy-3',5'-di-t-butylphenyl)benzotriazole, 2-(2'-hydroxy-3'-t-butyl-5'-methylphenyl)-5-chlorobenzotriazole, 2-(2'-hydroxy-3',5'-di-t-butylphenyl)-5-chlorobenzotriazole, 2-(2'-hydroxy-3',5'-di-t-amylphenyl)benzotriazole, and 2-{(2'-hydroxy-3',3'',4'',5'',6''-tetrahydrophthalimidemethyl)-5'-methylphenyl}benzotriazole; hindered amines such as bis(2,2,6,6-tetramethyl-4-piperidyl)sebacate, bis(1,2,2,6,6-pentamethyl-4-piperidyl)sebacate, and bis(1,2,2,6,6-pentamethyl-4-piperidyl)[{3,5-bis(1,1-dimethylethyl)-4-hydroxyphenyl}methyl]butyl malonate; and the like.

These UV absorbers may be used either alone or in combination.

The UV absorber is normally used in an amount of 0 to 10 parts by mass based on 100 parts by mass of the component (A) or (A').

The light stabilizer is added to the curable composition in order to improve the light resistance of the resulting cured product.

Examples of the light stabilizer include hindered amines such as poly[{6-(1,1,3,3-tetramethylbutyl)amino-1,3,5-triazine-2,4-diyl}{(2-tetramethyl-4-piperidine) imino}hexamethylene{(2,2,6,6-tetramethyl-4-piperidine) imino}] and the like.

These light stabilizers may be used either alone or in combination.

The light stabilizer is normally used in an amount of 0 to 10 parts by mass based on 100 parts by mass of the component (A) or (A').

The diluent is added to the curable composition in order to adjust the viscosity of the curable composition.

Examples of the diluent include glycerol diglycidyl ether, butanediol diglycidyl ether, diglycidylaniline, neopentyl glycol glycidyl ether, cyclohexanedimethanol diglycidyl ether, alkylene diglycidyl ether, polyglycol diglycidyl ether, polypropylene glycol diglycidyl ether, trimethylolpropane triglycidyl ether, glycerol triglycidyl ether, 4-vinylcyclohexene monoxide, vinylcyclohexene dioxide, methylated vinylcyclohexene dioxide, and the like.

These diluents may be used either alone or in combination.

The curable composition according to one embodiment of the invention may be obtained by mixing the component (A) or (A'), the component (B), the component (C), and an optional additional component in a given ratio, and defoaming the mixture using a known method.

The curable composition according to one embodiment of the invention thus obtained can produce a cured product that does not show coloration (i.e., does not show a deterioration in transparency) even when exposed to high-energy light or subjected to a high temperature, exhibits excellent transparency for a long time, and exhibits high adhesion.

Therefore, the curable composition according to one embodiment of the invention may suitably be used as a material for optical components or molded products, an adhesive, a coating agent, and the like. Since the curable composition according to one embodiment of the invention can prevent a deterioration in an optical device-securing material due to an increase in brightness of an optical device, the curable composition may suitably be used to produce an optical device-securing material.

2) Cured Product

A cured product according to one embodiment of the second aspect of the invention is produced by curing the curable composition according to one embodiment of the invention.

The curable composition according to one embodiment of the invention may be cured by heating. The heating temperature during curing is normally 100 to 200° C. The heating time is normally 10 minutes to 20 hours, and preferably 30 minutes to 10 hours.

The cured product according to one embodiment of the invention does not show coloration (i.e., does not show a deterioration in transparency) even when exposed to high-energy light or subjected to a high temperature, exhibits excellent transparency for a long time, and exhibits high adhesion.

Therefore, the cured product according to one embodiment of the invention may suitably be used as an optical component, a molded product, an adhesive layer, a coating layer, and the like. Since the cured product according to one embodiment of the invention can prevent a deterioration in an optical device-securing material due to an increase in brightness of an optical device, the cured product may suitably be used as an optical device-securing material.

The cured product according to one embodiment of the invention exhibits high adhesion when measuring the adhesion of the cured product by the following method, for example. Specifically, the curable composition is applied to a mirror surface of a silicon chip. The surface of the silicon chip to which the curable composition is applied is compression-bonded to an adherend, and the curable composition is cured by heating. After allowing the resulting product to stand for 30 seconds on a measurement stage of a bond tester which has been heated to a given temperature (e.g., 23 or 100° C.) in advance, the adhesion between the specimen and the adherend is measured while applying stress to the bonding surface between the specimen and the adherend in the horizontal direction (shearing direction) from a height of 50 µm above the adherend.

The cured product preferably has an adhesion at 23° C. of 110 N/2 mm$^2$ or more.

When measuring the light transmittance of the cured product according to one embodiment of the invention, the cured product exhibits excellent transparency. The light transmittance of the cured product is preferably 80% or more, and particularly preferably 86% or more at a wavelength of 400 nm. The light transmittance of the cured product is preferably 87% or more at a wavelength of 450 nm.

The cured product according to one embodiment of the invention exhibits excellent heat resistance since the cured product shows only a small change in adhesion and transparency even after the cured product is allowed to stand at a high temperature. The cured product preferably has an adhesion of 65% or more of that measured at 23° C. when the cured product is allowed to stand at 100° C. for 30 seconds. The cured product preferably has a transmittance (wavelength: 400 nm) of 70% or more, and more preferably 80% or more of the initial transmittance when the cured product is allowed to stand at 150° C. for 500 hours.

3) Method for Using of Curable Composition

Method for using according to one embodiment of the invention is method for using of the curable composition according to one embodiment of the third aspect of the invention as an optical device-securing adhesive or an optical device sealing material.

Examples of the optical device include a light-emitting device (e.g., LED and LD), a light-receiving device, a hybrid optical device, an optical integrated circuit, and the like.

Optical Device-Securing Adhesive

The curable composition according to one embodiment of the invention may suitably be used as an optical device-securing adhesive.

When using the curable composition according to one embodiment of the invention as an optical device-securing adhesive, the curable composition is applied to the bonding surface of one or both of the bonding target materials (e.g., an optical device and a substrate). The bonding target materials are then compression-bonded, and the curable composition is cured by heating to firmly bond the bonding target materials, for example.

Examples of a substrate material (to which an optical device is bonded) include glass such as soda lime glass and heat-resistant hard glass; ceramics; metals such as iron, copper, aluminum, gold, silver, platinum, chromium, titanium, alloys thereof, and stainless steel (e.g., SS302, SS304, SS304L, and SS309); synthetic resins such as polyethylene terephthalate, polybuthylene terephthalate, polyethylene naphthalate, an ethylene-vinyl acetate copolymer, polystyrene, polycarbonate, polymethylpentene, polysulfone, polyether ether ketone, polyether sulfone, polyphenylene sulfide, polyetherimide, polyimide, polyamide, an acrylic resin, a norbornene resin, a cycloolefin resin, and a glass epoxy resin; and the like.

The heating temperature employed when curing the curable composition is determined depending on the curable composition, but is normally 100 to 200° C. The heating time is normally 10 minutes to 20 hours, and preferably 30 minutes to 10 hours.

Optical Device Sealing Material

The curable composition according to one embodiment of the invention may suitably be used as an optical device sealing material.

When using the curable composition according to one embodiment of the invention as an optical device sealing material, the curable composition is molded into a desired shape, and an optical device is enclosed therein to prepare a molded product. The molded product is then cured by heating to produce a sealed optical device, for example.

The curable composition according to one embodiment of the invention may be molded into a desired shape by an arbitrary method. A known molding method such as a transfer molding method or a casting method may be used.

The heating temperature employed when curing the curable composition is determined depending on the curable composition and the like, but is normally 100 to 200° C. The heating time is normally 10 minutes to 20 hours, and preferably 30 minutes to 10 hours.

A sealed optical device produced by using the curable composition according to one embodiment of the invention exhibits excellent transparency (i.e., does not undergo coloration due to heat or light) and excellent heat resistance even if the optical device (e.g., white LED or blue LED) has a short peak wavelength of 400 to 490 nm.

EXAMPLES

The invention is further described below by way of examples and comparative examples. It should be noted that the invention is not limited to the following examples.

Measurement of Weight Average Molecular Weight

The polystyrene-reduced weight average molecular weight (Mw) and the polystyrene-reduced molecular weight distribution (Mw/Mn) of the silane compound copolymer obtained in each production example were determined using the following apparatus and conditions.

Apparatus: HLC-8220 GPC (manufactured by Tosoh Corporation)
Column: TSKgel GMHXL, TSKgel GMHXL, and TSKgel 12000 HXL were sequentially connected
Solvent: tetrahydrofuran
Injection amount: 80 µl
Measurement temperature: 40° C.
Flow rate: 1 ml/min
Detector: differential refractometer Measurement of IR Spectrum The IR spectrum of the silane compound copolymer obtained in each production example was determined using the following apparatus.

Fourier transform infrared spectrophotometer ("Spectrum 100" manufactured by Perkin-Elmer)

Production Example 1

A 300 ml recovery flask was charged with 16.7 g (84 mmol) of phenyltrimethoxysilane (manufactured by Tokyo Chemical Industry Co., Ltd.) (silane compound (2)), 8.0 g (36 mmol) of 3-acetoxypropyltrimethoxysilane (manufactured by AZmax Co.) (silane compound (1)), 60 ml of toluene, and 30 ml of distilled water as solvents. After the addition of 0.15 g (1.5 mmol) of phosphoric acid (manufactured by Kanto Chemical Co., Inc.) (catalyst) with stirring, the mixture was stirred at room temperature for a further 16 hours.

After completion of the reaction, 100 ml of ethyl acetate was added to the reaction mixture. The mixture was neutralized with a saturated aqueous solution of sodium hydrogen carbonate. After allowing the mixture to stand for a while, the organic layer was isolated preparatively. The organic layer was then washed twice with distilled water, and dried over anhydrous magnesium sulfate. After separating magnesium sulfate by filtration, the filtrate was concentrated to 50 ml using an evaporator, and added dropwise to a large quantity of n-hexane to effect precipitation. The resulting precipitate was separated by decantation. The precipitate thus separated was dissolved in methyl ethyl ketone, and the solution was recovered. After evaporating the solvent under reduced pressure using an evaporator, the residue was dried under vacuum to obtain 14.7 g of a silane compound copolymer (A1).

The weight average molecular weight (Mw) of the silane compound copolymer (A1) was 2700, and the molecular weight distribution (Mw/Mn) of the silane compound copolymer (A1) was 1.53.

The IR spectrum data of the silane compound copolymer (A1) is shown below. Si-Ph: 699 cm$^{-1}$, 741 cm$^{-1}$, Si—O: 1132 cm$^{-1}$, —CO: 1738 cm$^{-1}$ Production Example 2

15.9 g of a silane compound copolymer (A2) was obtained in the same manner as in Production Example 1, except for changing the amount of phenyltrimethoxysilane to 14.3 g (72 mmol), and changing the amount of 3-acetoxypropyltrimethoxysilane to 10.7 g (48 mmol).

The weight average molecular weight (Mw) of the silane compound copolymer (A2) was 2600, and the molecular weight distribution (Mw/Mn) of the silane compound copolymer (A2) was 1.50.

The IR spectrum data of the silane compound copolymer (A2) is shown below. Si-Ph: 699 cm$^{-1}$, 741 cm$^{-1}$, Si—O: 1132 cm$^{-1}$, —CO: 1738 cm$^{-1}$ Production Example 3

15.3 g of a silane compound copolymer (A3) was obtained in the same manner as in Production Example 1, except for changing the amount of phenyltrimethoxysilane to 11.9 g (60 mmol), and changing the amount of 3-acetoxypropyltrimethoxysilane to 13.3 g (60 mmol).

The weight average molecular weight (Mw) of the silane compound copolymer (A3) was 2600, and the molecular weight distribution (Mw/Mn) of the silane compound copolymer (A3) was 1.60.

The IR spectrum data of the silane compound copolymer (A3) is shown below. Si-Ph: 700 cm$^{-1}$, 742 cm$^{-1}$, Si—O: 1132 cm$^{-1}$, —CO: 1738 cm$^{-1}$ Production Example 4

16.3 g of a silane compound copolymer (A4) was obtained in the same manner as in Production Example 1, except for changing the amount of phenyltrimethoxysilane to 11.9 g (60 mmol), and using 14.2 g (60 mmol) of 3-glycidoxypropyltrimethoxysilane (manufactured by Tokyo Chemical Industry Co., Ltd.) (indicated as "GlyTMS" in Table 1-1 and Table 1-2) instead of 16.7 g (84 mmol) of phenyltrimethoxysilane and 8.0 g (36 mmol) of 3-acetoxypropyltrimethoxysilane The weight average molecular weight (Mw) of the silane compound copolymer (A4) was 2800, and the molecular weight distribution (Mw/Mn) of the silane compound copolymer (A4) was 1.56.

The IR spectrum data of the silane compound copolymer (A4) is shown below. Si-Ph: 700 cm$^{-1}$, 742 cm$^{-1}$, Si—O: 1132 cm$^{-1}$, epoxy group: 1254 cm$^{-1}$ Production Example 5

A 300 ml recovery flask was charged with 19.0 g (96 mmol) of phenyltrimethoxysilane (manufactured by Tokyo Chemical Industry Co., Ltd.) (silane compound (2)), 4.77 g (24 mmol) of 3-chloropropyltrimethoxysilane (manufactured by Tokyo Chemical Industry Co., Ltd.) (silane compound (1)), 60 ml of toluene, and 30 ml of distilled water as solvents. After the addition of 0.15 g (1.5 mmol) of phosphoric acid (manufactured by Kanto Chemical Co., Inc.) (catalyst) with stirring, the mixture was stirred at room temperature for a further 16 hours.

After completion of the reaction, the reaction mixture was neutralized with a saturated sodium hydrogen carbonate aqueous solution. After the addition of 100 ml of ethyl acetate, the mixture was allowed to stand, and the organic layer was isolated preparatively. The organic layer was then washed twice with distilled water, and dried over anhydrous magnesium sulfate. After separating anhydrous magnesium sulfate by filtration, the filtrate was added dropwise to a large quantity of n-hexane to effect precipitation. The resulting precipitate was separated by decantation. The precipitate was dissolved in methyl ethyl ketone, and the solution was recovered. After evaporating the solvent under reduced pressure using an evaporator, the residue was dried under vacuum to obtain 13.6 g of a silane compound copolymer (A5).

The weight average molecular weight (Mw) of the silane compound copolymer (A5) was 3000, and the molecular weight distribution (Mw/Mn) of the silane compound copolymer (A5) was 1.59.

The IR spectrum data of the silane compound copolymer (A5) is shown below. Si-Ph: 700 cm$^{-1}$, 741 cm$^{-1}$, Si—O: 1132 cm$^{-1}$, —Cl: 648 cm$^{-1}$ Production Example 6

13.4 g of a silane compound copolymer (A6) was obtained in the same manner as in Production Example 5, except for changing the amount of phenyltrimethoxysilane to 16.7 g (84 mmol), and changing the amount of 3-chloropropyltrimethoxysilane to 7.15 g (36 mmol).

The weight average molecular weight (Mw) of the silane compound copolymer (A6) was 3300, and the molecular weight distribution (Mw/Mn) of the silane compound copolymer (A6) was 1.59.

The IR spectrum data of the silane compound copolymer (A6) is shown below. Si-Ph: 700 cm$^{-1}$, 742 cm$^{-1}$, Si—O: 1133 cm$^{-1}$, —Cl: 648 cm$^{-1}$ Production Example 7

13.0 g of a silane compound copolymer (A7) was obtained in the same manner as in Production Example 5, except for changing the amount of phenyltrimethoxysilane to 14.3 g (72 mmol), and changing the amount of 3-chloropropyltrimethoxysilane to 9.54 g (48 mmol).

The weight average molecular weight (Mw) of the silane compound copolymer (A7) was 3500, and the molecular weight distribution (Mw/Mn) of the silane compound copolymer (A7) was 1.61.

The IR spectrum data of the silane compound copolymer (A7) is shown below. Si-Ph: 699 cm$^{-1}$, 741 cm$^{-1}$, Si—O: 1132 cm$^{-1}$, —Cl: 648 cm$^{-1}$ Production Example 8

12.9 g of a silane compound copolymer (A8) was obtained in the same manner as in Production Example 5, except for changing the amount of phenyltrimethoxysilane to 11.9 g (60 mmol), and changing the amount of 3-chloropropyltrimethoxysilane to 11.9 g (60 mmol).

The weight average molecular weight (Mw) of the silane compound copolymer (A8) was 3600, and the molecular weight distribution (Mw/Mn) of the silane compound copolymer (A8) was 1.63.

The IR spectrum data of the silane compound copolymer (A8) is shown below. Si-Ph: 700 cm$^{-1}$, 741 cm$^{-1}$, Si—O: 1133 cm$^{-1}$, —Cl: 648 cm$^{-1}$ Example 1

1.0 g of 2-(3,4-epoxycyclohexyl)ethyltrimethoxysilane (manufactured by Tokyo Chemical Industry Co., Ltd.) (silane coupling agent (B)) (indicated by "B1" in Tables 1-1 and 1-2) and 0.1 g of cyclohexane-1,2,4-tricarboxylic-1,2-anhydride (manufactured by Mitsubishi Gas Chemical Co., Ltd.) (curing agent (C)) (indicated by "C1" in Tables 1-1 and 1-2) were added to 10 g of the silane compound copolymer (A1) obtained in Production Example 1. The mixture was sufficiently mixed, and defoamed to obtain a curable composition (1).

Example 2

A curable composition (2) was obtained in the same manner as in Example 1, except for using 1.0 g of 2-(3,4-epoxycyclohexyl)ethyltriethoxysilane (manufactured by AZmax Co.) (silane coupling agent (B)) (indicated by "B2" in Tables 1-1 and 1-2) instead of 2-(3,4-epoxycyclohexyl)ethyltrimethoxysilane Examples 3 to 7

Curable compositions (3) to (7) were obtained in the same manner as in Example 1, except for changing the amounts of the silane compound copolymer, the silane coupling agent, and the curing agent as shown in Table 1.

Example 8

A curable composition (8) was obtained in the same manner as in Example 1, except for adding 0.5 g of 3-(triethoxysilyl)propylsuccinic anhydride (manufactured by AZmax Co.) (silane coupling agent having an acid anhydride structure other than the silane coupling agent (B)) (indicated by "D" in Tables 1-1 and 1-2).

Example 9

A curable composition (9) was obtained in the same manner as in Example 1, except for adding 0.1 g of 4-methylcyclohexane-1,2-dicarboxylic anhydride (manufactured by Tokyo Chemical Industry Co., Ltd.) (curing agent (C)) (indicated by "C2" in Tables 1-1 and 1-2).

Comparative Examples 1 to 4

Curable compositions (10) to (13) were obtained in the same manner as in Example 1, except for changing the amounts of the silane compound copolymer, the silane coupling agent, and the curing agent as shown in Table 1-1.

Comparative Example 5

A curable composition (14) was obtained in the same manner as in Example 1, except for using the silane compound copolymer (A4) obtained in Production Example 4 instead of the silane compound copolymer (A1) obtained in Production Example 1.

Example 10

1.0 g of 2-(3,4-epoxycyclohexyl)ethyltrimethoxysilane (manufactured by Tokyo Chemical Industry Co., Ltd.) (silane coupling agent (B)) and 0.1 g of cyclohexane-1,2,4-tricarboxylic-1,2-anhydride (manufactured by Mitsubishi Gas Chemical Co., Ltd.) (curing agent (C)) were added to 10 g of the silane compound copolymer (A5) obtained in Production Example 5. The mixture was sufficiently mixed, and defoamed to obtain a curable composition (15).

Examples 11 to 13 and Comparative Examples 6 to 9

Curable compositions (16) to (22) were obtained in the same manner as in Example 10, except for changing the amounts of the silane compound copolymer, the silane coupling agent, and the curing agent as shown in Table 1-2.

TABLE 1-1

| | | | Silane compound random copolymer | | | | Silane coupling | Curing agent | | Additive | |
| | | | Composition (mol %) | | | | agent (parts by mass) | (parts by mass) | | (parts by mass) | (A): [(B) + (C)] |
| | Curable composition | Type | Silane compound (1a) | Silane compound (1b) | Silane compound (2) | GlyTMS | (parts by mass) | B1 | B2 | C1 | C2 | D | (mass ratio) |
|---|---|---|---|---|---|---|---|---|---|---|---|---|---|
| Example 1 | 1 | A1 | 30 | — | 70 | — | 10 | 1 | — | 0.1 | — | — | 90:10 |
| Example 2 | 2 | A1 | 30 | — | 70 | — | 10 | — | 1 | 0.1 | — | — | 90:10 |
| Example 3 | 3 | A1 | 30 | — | 70 | — | 10 | 2 | — | 0.2 | — | — | 82:18 |
| Example 4 | 4 | A2 | 40 | — | 60 | — | 10 | 1 | — | 0.1 | — | — | 90:10 |

TABLE 1-1-continued

| | Curable composition | Type | Silane compound random copolymer Composition (mol %) Silane compound (1a) | Silane compound (1b) | Silane compound (2) | GlyTMS | Silane coupling agent (parts by mass) | Curing agent (parts by mass) B1 | B2 | (parts by mass) C1 | C2 | Additive (parts by mass) D | (A): [(B) + (C)] (mass ratio) |
|---|---|---|---|---|---|---|---|---|---|---|---|---|---|
| Example 5 | 5 | A2 | 40 | — | 60 | — | 10 | 2 | — | 0.2 | — | — | 82:18 |
| Example 6 | 6 | A3 | 50 | — | 50 | — | 10 | 2 | — | 0.2 | — | — | 82:18 |
| Example 7 | 7 | A3 | 50 | — | 50 | — | 10 | 3 | — | 0.3 | — | — | 75:25 |
| Example 8 | 8 | A1 | 30 | — | 70 | — | 10 | 1 | — | 0.1 | — | 0.5 | 90:10 |
| Example 9 | 9 | A1 | 30 | — | 70 | — | 10 | 1 | — | 0.1 | 0.1 | — | 89:11 |
| Comparative Example 1 | 10 | A1 | 30 | — | 70 | — | 10 | — | — | 0.1 | — | — | — |
| Comparative Example 2 | 11 | A1 | 30 | — | 70 | — | 10 | 1 | — | — | — | — | — |
| Comparative Example 3 | 12 | A1 | 30 | — | 70 | — | 10 | 0.1 | — | 0.01 | — | — | 99:1 |
| Comparative Example 4 | 13 | A1 | 30 | — | 70 | — | 10 | 5 | — | 0.5 | — | — | 65:35 |
| Comparative Example 5 | 14 | A4 | — | — | 50 | 50 | 10 | 1 | — | 0.1 | — | — | — |

Silane compound (1a): 3-acetoxypropyltrimethoxysilane
Silane compound (1b): 3-chloropropyltrimethoxysilane
Silane compound (2): phenyltrimethoxysilane

TABLE 1-2

| | Curable composition | Type | Silane compound random copolymer Composition ratio (mol %) Silane compound (1a) | Silane compound (1b) | Silane compound (2) | GlyTMS | Silane coupling agent (parts by mass) | Curing agent (parts by mass) B1 | B2 | (parts by mass) C1 | C2 | Additive (parts by mass) D | (A): [(B) + (C)] (mass ratio) |
|---|---|---|---|---|---|---|---|---|---|---|---|---|---|
| Example 10 | 15 | A5 | — | 20 | 80 | — | 10 | 1 | — | 0.1 | — | — | 90:10 |
| Example 11 | 16 | A6 | — | 30 | 70 | — | 10 | 1 | — | 0.1 | — | — | 90:10 |
| Example 12 | 17 | A7 | — | 40 | 60 | — | 10 | 1 | — | 0.1 | — | — | 90:10 |
| Example 13 | 18 | A8 | — | 50 | 50 | — | 10 | 1 | — | 0.1 | — | — | 90:10 |
| Comparative Example 6 | 19 | A6 | — | 30 | 70 | — | 10 | — | — | 0.1 | — | — | — |
| Comparative Example 7 | 20 | A6 | — | 30 | 70 | — | 10 | 1 | — | — | — | — | — |
| Comparative Example 8 | 21 | A6 | — | 30 | 70 | — | 10 | 0.1 | — | 0.01 | — | — | 99:1 |
| Comparative Example 9 | 22 | A6 | — | 30 | 70 | — | 10 | 5 | — | 0.5 | — | — | 65:35 |

Silane compound (1a): 3-acetoxypropyltrimethoxysilane
Silane compound (1b): 3-chloropropyltrimethoxysilane
Silane compound (2): phenyltrimethoxysilane The adhesion, the initial transmittance, and the transmittance after heating of the curable compositions 1 to 22 obtained in Examples 1 to 13 and Comparative Examples 1 to 9 were measured by the following methods to evaluate the adhesive heat resistance, the initial transparency, and the heat resistance (transparency after heating).

The measurement results and the evaluation results are shown in Tables 2-1 and 2-2.

Adhesion Test

The curable composition (1 to 22) was applied to a mirror surface of a silicon chip (2×2 mm) to a thickness of about 2 μm. The surface of the silicon chip to which the curable composition was applied was compression-bonded to an adherend (silver-plated copper plate). The curable composition was cured by heating the curable composition at 180° C. for 2 hours to prepare a specimen-bonded adherend. After allowing the specimen-bonded adherend to stand for 30 seconds on a measurement stage of a bond tester ("Series 4000" manufactured by Dage Co., Ltd.) which had been heated to a given temperature (23° C. or 100° C.) in advance, the adhesion (N/2 mm$^2$) (23° C. and 100° C.) between the specimen and the adherend was measured while applying stress (speed: 200 μm/sec) to the bonding surface between the specimen and the adherend in the horizontal direction (shearing direction) from a height of 50 μm above the adherend.

Adhesive Heat Resistance

A case where the adhesion measured at 100° C. was 65% or more of the adhesion measured at 23° C. was evaluated as "Acceptable", and a case where the adhesion measured at 100° C. was less than 65% of the adhesion measured at 23° C. was evaluated as "Unacceptable".

Measurement of Initial Transmittance

The curable composition (1 to 22) was poured into a mold so as to have a length of 25 mm, a width of 20 mm, and a thickness of 1 mm, and cured by heating the curable composition at 140° C. for 6 hours to prepare a specimen. The initial transmittance (%) (wavelength: 400 nm and 450 nm) of the specimen was measured using a spectrophotometer ("MPC-3100" manufactured by Shimadzu Corporation).

Initial Transparency

A case where the initial transmittance of light having a wavelength of 400 nm was 80% or more was evaluated as "Acceptable", a case where the initial transmittance of light having a wavelength of 400 nm was 70% or more and less than 80% was evaluated as "Fair", and a case where the initial transmittance of light having a wavelength of 400 nm was less than 70% was evaluated as "Unacceptable".

Measurement of Transmittance after Heating

The specimen for which the initial transmittance had been measured was allowed to stand in an oven at 150° C. for 500 hours, and the transmittance (%) (wavelength: 400 nm and 450 nm) of the specimen was measured. The transmittance thus measured was taken as the transmittance after heating.

Heat Resistance (Transparency after Heating)

A case where the transmittance of light having a wavelength of 400 nm was 80% or more of the initial transmittance was evaluated as "Acceptable", a case where the transmittance of light having a wavelength of 400 nm was 70% or more and less than 80% of the initial transmittance was evaluated as "Fair", and a case where the transmittance of light having a wavelength of 400 nm was less than 70% of the initial transmittance was evaluated as "Unacceptable".

TABLE 2-1

| | Curable composition | Adhesion (N/2 mm$^2$) | | Adhesive heat resistance | Initial transmittance (%) | | Initial transparency | Transmittance after heating (%) | | Heat resistance (transparency after heating) |
|---|---|---|---|---|---|---|---|---|---|---|
| | | 23° C. | 100° C. | | 400 nm | 450 nm | | 400 nm | 450 nm | |
| Example 1 | 1 | 146.2 | 109.7 | Acceptable | 88.3 | 90.6 | Acceptable | 84.7 | 89.6 | Acceptable |
| Example 2 | 2 | 139.4 | 106.1 | Acceptable | 89.0 | 90.5 | Acceptable | 85.1 | 89.5 | Acceptable |
| Example 3 | 3 | 133.6 | 105.6 | Acceptable | 87.1 | 89.8 | Acceptable | 84.4 | 88.1 | Acceptable |
| Example 4 | 4 | 124.4 | 89.7 | Acceptable | 88.2 | 90.6 | Acceptable | 85.0 | 89.3 | Acceptable |
| Example 5 | 5 | 128.5 | 92.3 | Acceptable | 87.2 | 89.6 | Acceptable | 84.5 | 88.4 | Acceptable |
| Example 6 | 6 | 117.7 | 80.1 | Acceptable | 87.5 | 90.1 | Acceptable | 85.2 | 88.9 | Acceptable |
| Example 7 | 7 | 121.5 | 84.8 | Acceptable | 87.0 | 88.9 | Acceptable | 84.0 | 87.9 | Acceptable |
| Example 8 | 8 | 152.7 | 111.4 | Acceptable | 86.7 | 87.8 | Acceptable | 83.4 | 87.2 | Acceptable |
| Example 9 | 9 | 149.3 | 107.9 | Acceptable | 86.4 | 90.4 | Acceptable | 84.9 | 89.7 | Acceptable |
| Comparative Example 1 | 10 | 91.8 | 27.0 | Unacceptable | 88.8 | 90.9 | Acceptable | 85.1 | 89.7 | Acceptable |
| Comparative Example 2 | 11 | 107.1 | 68.6 | Unacceptable | 88.4 | 90.5 | Acceptable | 84.9 | 89.6 | Acceptable |
| Comparative Example 3 | 12 | 98.0 | 35.4 | Unacceptable | 89.1 | 91.7 | Acceptable | 85.8 | 90.0 | Acceptable |
| Comparative Example 4 | 13 | 50.8 | 22.1 | Unacceptable | 89.8 | 90.5 | Acceptable | 70.8 | 79.2 | Fair |
| Comparative Example 5 | 14 | 161.9 | 108.3 | Acceptable | 87.7 | 91.2 | Acceptable | 12.6 | 50.3 | Unacceptable |

TABLE 2-2

| | Curable composition | Adhesion (N/2 mm$^2$) | | Adhesive heat resistance | Initial transmittance (%) | | Initial transparency | Transmittance after heating (%) | | Heat resistance (transparency after heating) |
|---|---|---|---|---|---|---|---|---|---|---|
| | | 23° C. | 100° C. | | 400 nm | 450 nm | | 400 nm | 450 nm | |
| Example 10 | 15 | 134.4 | 105.2 | Acceptable | 88.6 | 90.4 | Acceptable | 85.3 | 89.5 | Acceptable |
| Example 11 | 16 | 127.6 | 96.7 | Acceptable | 89.0 | 89.9 | Acceptable | 84.7 | 89.0 | Acceptable |
| Example 12 | 17 | 123.5 | 90.0 | Acceptable | 89.3 | 90.8 | Acceptable | 84.9 | 89.0 | Acceptable |
| Example 13 | 18 | 109.1 | 85.9 | Acceptable | 89.0 | 90.1 | Acceptable | 84.1 | 88.8 | Acceptable |
| Comparative Example 6 | 19 | 79.3 | 24.6 | Unacceptable | 88.6 | 89.5 | Acceptable | 84.3 | 87.7 | Acceptable |
| Comparative Example 7 | 20 | 106.2 | 65.8 | Unacceptable | 89.1 | 90.5 | Acceptable | 84.6 | 88.0 | Acceptable |
| Comparative Example 8 | 21 | 84.9 | 32.5 | Unacceptable | 87.6 | 89.3 | Acceptable | 85.0 | 87.4 | Acceptable |
| Comparative Example 9 | 22 | 55.4 | 21.9 | Unacceptable | 86.3 | 87.4 | Acceptable | 65.5 | 76.1 | Fair |

As is clear from Tables 2-1 and 2-2, the cured products of the curable compositions 1 to 9 and 15 to 18 (Examples 1 to 13) exhibited high adhesion (109 N/2 mm² or more) at 23° C. The adhesion measured at a high temperature (100° C.) was 65% or more of the adhesion measured at 23° C. Thus, the cured products of the curable compositions 1 to 9 and 15 to 18 had excellent adhesive heat resistance. The cured products of the curable compositions 1 to 9 and 15 to 18 also exhibited a high initial transmittance and a high transmittance after heating (wavelength: 400 nm and 450 nm). Thus, the cured products of the curable compositions 1 to 9 and 15 to 18 had excellent initial transparency and excellent heat resistance (transparency after heating).

The cured products of the curable compositions 10 to 13 and 19 to 22 (Comparative Examples 1 to 4 and 6 to 9) exhibited poor adhesive heat resistance. The cured product of the curable composition 14 (Comparative Example 5) exhibited significantly poor heat resistance (transparency after heating).

The invention claimed is:

1. A curable composition comprising (A) a silane compound copolymer that includes repeating units respectively shown by formulas (i) and (ii), (i) and (iii), (ii) and (iii), or (i), (ii), and (iii), and has a weight average molecular weight of 1000 to 30,000, (B) a silane coupling agent having a reactive cyclic ether structure, and (C) a curing agent so that a mass ratio "(A):((B)+(C))" of the silane compound copolymer (A) to the silane coupling agent (B) and the curing agent (C) in total is 95:5 to 70:30,

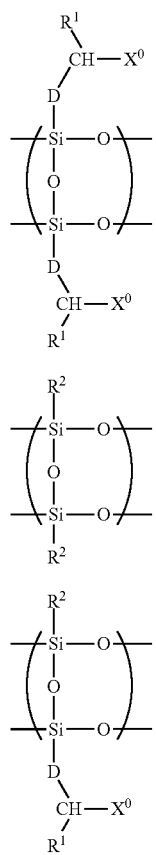

wherein $R^1$ represents a hydrogen atom or an alkyl group having 1 to 6 carbon atoms, $X^0$ represents a halogen atom or a group shown by OG (wherein G represents a protecting group for a hydroxyl group), D represents a single bond or a linking group, and $R^2$ represents an alkyl group having 1 to 20 carbon atoms or a substituted or unsubstituted phenyl group.

2. The curable composition according to claim 1, wherein the silane compound copolymer (A) includes a group shown by $R^1$—CH($X^0$)-D- and $R^2$ in a molar ratio "$R^1$—CH($X^0$)-D: $R^2$" of 60:40 to 5:95.

3. A curable composition comprising (A') a silane compound copolymer that is produced by condensing a silane compound mixture, and has a weight average molecular weight of 1000 to 30,000, (B) a silane coupling agent having a reactive cyclic ether structure, and (C) a curing agent so that a mass ratio "(A'):((B)+(C))" of the silane compound copolymer (A') to the silane coupling agent (B) and the curing agent (C) in total is 95:5 to 70:30, the silane compound mixture including at least one silane compound (1) shown by a formula (1) and at least one silane compound (2) shown by a formula (2), $$R^1\text{—CH}(X^0)\text{-D-Si}(OR^3)_p(X^1)_{3-p} \qquad (1)$$

wherein $R^1$ represents a hydrogen atom or an alkyl group having 1 to 6 carbon atoms, $X^0$ represents a halogen atom or a group shown by OG (wherein G represents a protecting group for a hydroxyl group), D represents a single bond or a linking group, $R^3$ represents an alkyl group having 1 to 6 carbon atoms, $X^1$ represents a halogen atom, and p is an integer from 0 to 3, $$R^2\text{Si}(OR^4)_q(X^2)_{3-q} \qquad (2)$$

wherein $R^2$ represents an alkyl group having 1 to 20 carbon atoms or a substituted or unsubstituted phenyl group, $R^4$ represents an alkyl group having 1 to 6 carbon atoms, $X^2$ represents a halogen atom, and q is an integer from 0 to 3.

4. The curable composition according to claim 3, wherein the silane compound copolymer (A') is obtained by condensing the at least one silane compound (1) and the at least one silane compound (2) in a molar ratio of 60:40 to 5:95.

5. The curable composition according to claim 1, the curable (B:C) composition including the silane coupling agent (B) and the curing agent (C) in a mass ratio of 95:5 to 70:30.

6. The curable composition according to claim 1, wherein the silane coupling agent (B) includes a cyclohexene oxide group.

7. The curable composition according to claim 1, wherein the curing agent (C) includes one or more compounds selected from a carboxyl group-containing alicyclic acid anhydride and an alicyclic acid anhydride other than the carboxyl group-containing alicyclic acid anhydride so that a mass ratio of the carboxyl group-containing alicyclic acid anhydride to the alicyclic acid anhydride other than the carboxyl group-containing alicyclic acid anhydride is 100:0 to 10:90.

8. An optical device-securing material comprising the curable composition according to claim 1.

9. A cured product obtained by curing the curable composition according to claim 1.

10. The cured product according to claim 9, the cured product being an optical device-securing material.

11. An optical device-securing adhesive comprising the curable composition according to claim 1.

12. An optical device sealing material comprising the curable composition according to claim 1.

13. The curable composition according to claim 3, the curable composition including the silane coupling agent (B) and the curing agent (C) in a mass ratio of 95:5 to 70:30.

14. The curable composition according to claim 3, wherein the silane coupling agent (B) includes a cyclohexene oxide group.

15. The curable composition according to claim 3, wherein the curing agent (C) includes one or more compounds selected from a carboxyl group-containing alicyclic acid anhydride and an alicyclic acid anhydride other than the carboxyl group-containing alicyclic acid anhydride so that a mass ratio of the carboxyl group-containing alicyclic acid anhydride to the alicyclic acid anhydride other than the carboxyl group-containing alicyclic acid anhydride is 100:0 to 10:90.

16. An optical device-securing material comprising the curable composition according to claim 3.

17. A cured product obtained by curing the curable composition according to claim 3.

18. An optical device-securing adhesive comprising the curable composition according to claim 3.

19. An optical device sealing material comprising the curable composition according to claim 3.

\* \* \* \* \*